(12) United States Patent
Liu et al.

(10) Patent No.: US 12,317,523 B2
(45) Date of Patent: May 27, 2025

(54) METAL-INSULATOR-METAL CAPACITOR STRUCTURE AND PREPARATION METHOD THEREFOR

(71) Applicant: CANSEMI TECHNOLOGY INC., Guangdong (CN)

(72) Inventors: Xiang Liu, Guangdong (CN); Jiaxi Wang, Guangdong (CN)

(73) Assignee: CANSEMI TECHNOLOGY INC., Guangzhou (CN)

( * ) Notice: Subject to any disclaimer, the term of this patent is extended or adjusted under 35 U.S.C. 154(b) by 0 days.

(21) Appl. No.: 18/691,628

(22) PCT Filed: Jan. 28, 2022

(86) PCT No.: PCT/CN2022/074720
§ 371 (c)(1),
(2) Date: Mar. 13, 2024

(87) PCT Pub. No.: WO2023/035545
PCT Pub. Date: Mar. 16, 2023

(65) Prior Publication Data
US 2024/0379736 A1    Nov. 14, 2024

(30) Foreign Application Priority Data
Sep. 13, 2021 (CN) .......................... 202111066013.5

(51) Int. Cl.
*H10D 1/68* (2025.01)
(52) U.S. Cl.
CPC ............. *H10D 1/716* (2025.01); *H10D 1/696* (2025.01)

(58) Field of Classification Search
CPC ............ H10D 1/60; H10D 1/68; H10D 1/694; H10D 1/696; H10D 1/711; H10D 1/712;
(Continued)

(56) References Cited

U.S. PATENT DOCUMENTS 6,430,028 B1    8/2002  Kar-Roy et al.
10,615,249 B2*  4/2020  Liu ..................... H01L 23/5226
(Continued)

FOREIGN PATENT DOCUMENTS

CN          1925154 A      3/2007
CN        101160663 A      4/2008
(Continued)

*Primary Examiner* — Thanhha S Pham
(74) *Attorney, Agent, or Firm* — MUNCY, GEISSLER, OLDS & LOWE, P.C.

(57) ABSTRACT

Disclosed are a metal-insulator-metal (MIM) capacitor structure and a method for fabricating the structure. The MIM capacitor structure includes: a substrate; a capacitor structure comprising a bottom metal layer, an interlayer dielectric layer and a top metal layer sequentially stacked over the substrate; an opening extending downward through the top metal layer into the interlayer dielectric layer; a recess located at a side wall of the opening, and extending from a bottom of the opening downward into the interlayer dielectric layer; and a sidewall spacer located in the opening, which extends over a side wall of the top metal layer and downward into the recess so as to fill it up, wherein the interlayer dielectric layer is made of the same material as the sidewall spacer. The MIM capacitor structure and a fabricating method therefor can improve the breakdown voltage of the MIM capacitor structure.

11 Claims, 4 Drawing Sheets

(58) Field of Classification Search
CPC ........ H10D 1/714; H10D 1/716; H10B 12/02; H10B 12/053; H10B 12/30; H10B 12/315; H10B 12/373; H01B 12/37
See application file for complete search history.

(56) References Cited

U.S. PATENT DOCUMENTS

| | | |
|---|---|---|
| 2012/0248571 A1 | 10/2012 | Lin et al. |
| 2016/0035817 A1 | 2/2016 | Hsu et al. |
| 2017/0330931 A1 | 11/2017 | Cheng et al. |

FOREIGN PATENT DOCUMENTS

| | | |
|---|---|---|
| CN | 103367104 A | 10/2013 |
| CN | 105514092 A | 4/2016 |
| CN | 105632897 A | 6/2016 |
| CN | 107369669 A | 11/2017 |
| CN | 107895687 A | 4/2018 |
| CN | 113517400 A | 10/2021 |
| TW | 201241962 A | 10/2012 |

* cited by examiner

METAL-INSULATOR-METAL CAPACITOR STRUCTURE AND PREPARATION METHOD THEREFOR

TECHNICAL FIELD

The present invention relates to the field of semiconductor technology, and, in particular, to a metal-insulator-metal (MIM) capacitor structure and a method for fabricating the structure.

BACKGROUND

Metal-insulator-metal (MIM) capacitors are widely used in analog circuits and radio frequency (RF) circuits thanks to their low parasitic resistance. Different applications require MIM capacitors with difference parasitic resistance. For an RF circuit, since it operates at a high frequency (in the gigahertz range) and hence has low capacitive reactance, such parasitic resistance accounts for a high proportion of the total impedance and it therefore would be desirable to reduce the parasitic resistance as much as possible. However, in a low-frequency analog circuit, for example, used in a display panel driver chip, an MIM capacitor is typically used for charge storage in a charge pump and thus required to provide a relatively high breakdown voltage. Accordingly, stringent time-dependent dielectric breakdown (TDDB) voltage requirements are typically imposed on the MIM capacitor.

FIG. 1 is a schematic cross-sectional view of an MIM capacitor structure. Referring to FIG. 1, the MIM capacitor structure includes a substrate 10, a capacitor structure formed on the substrate 10, an opening (not labeled), a passivation layer 30, a number of first electrical connection elements 41 and a number of second electrical connection elements 42. The capacitor structure includes a bottom metal layer 21, an interlayer dielectric layer 22 and a top metal layer 23, which are sequentially stacked over the substrate 10. The opening is formed in the top metal layer 23, and the interlayer dielectric layer 22 is exposed therein. The passivation layer 30 fills up the opening and covers the top metal layer 23. The first electrical connection elements 41 and second electrical connection elements 42 are formed in the passivation layer 30. The first electrical connection elements 41 extend through the passivation layer 30 and the interlayer dielectric layer 22b, and are electrically connected to the bottom metal layer 21. The second electrical connection elements 42 extend through the passivation layer 30 and are electrically connected to the top metal layer 23. Capacitance of the MIM capacitor structure is determined by a thickness and a width of the interlayer dielectric layer 22 between the bottom metal layer 21 and the top metal layer 23. The thinner the dielectric layer is, the greater the capacitance will be. However, a lower breakdown voltage of the MIM capacitor structure will result in more inferior reliability (characterized by the capacitor's TDDB voltage) at a given operating voltage. The TDDB voltage is a metric for accessing quality of the dielectric layer in terms of reliability. When a constant voltage is applied to the two terminals of the MIM capacitor structure, charges will accumulate therein and the dielectric layer will be broken down after a period of time. This period of time represents a life time of the MIM capacitor structure under the condition. A MIM capacitor structure with poorer TDDB performance will be more easily broken down, possibly leading to failure of a chip.

SUMMARY OF THE INVENTION

It is an object of the present invention to provide an MIM capacitor structure and a fabrication method therefor to increase the breakdown voltage of the MIM capacitor structure.

To this end, the present invention provides an MIM capacitor structure, comprising:
- a substrate;
- a capacitor structure, comprising a bottom metal layer, an interlayer dielectric layer and a top metal layer that are sequentially stacked over the substrate;
- an opening extending downward through the top metal layer into the interlayer dielectric layer;
- a recess, formed at a side wall of the opening and extending from a bottom of the opening downward into the interlayer dielectric layer; and
- a sidewall spacer located in the opening, which extends over a side wall of the top metal layer and downward into the recess so as to fill it up.

Optionally, each of the bottom metal layer and the top metal layer may be made of a material comprising one or more of titanium, copper or aluminum.

Optionally, the interlayer dielectric layer may be made of the same material as the sidewall spacer.

Optionally, each of the interlayer dielectric layer and the sidewall spacer may be made of a material comprising any one of silicon nitride, silicon oxide or silicon oxynitride.

Optionally, the MIM capacitor structure may further comprise:
- a passivation layer covering the top metal layer and filling the opening;
- a first electrical connection element located in the opening, wherein the first electrical connection element extends through the passivation layer and is electrically connected to the bottom metal layer;
- a second electrical connection element located above the top metal layer, wherein the second electrical connection element extends through the passivation layer and is electrically connected to the top metal layer.

To the above end, the present invention also provides a method for fabricating an MIM capacitor structure, comprising:
- providing a substrate;
- forming a capacitor structure on the substrate, the capacitor structure comprising a bottom metal layer, an interlayer dielectric layer and a top metal layer that are sequentially stacked over the substrate;
- forming an opening extending downward through the top metal layer into the interlayer dielectric layer, wherein as a result of the formation of the opening, a recess is formed at a side wall of the opening, and wherein the recess extends from a bottom of the opening further downward into the interlayer dielectric layer; and
- forming a sidewall spacer in the opening, wherein the sidewall spacer extends over a side wall of the top metal layer and downward into the recess so as to fill it up.

Optionally, the formation of the capacitor structure and the opening may comprise:
- sequentially forming the bottom metal layer, the interlayer dielectric layer, the top metal layer and a patterned photoresist layer that are stacked one above another over the substrate;
- forming the opening and the recess by etching away a portion of the top metal layer and a partial thickness of the interlayer dielectric layer, with the patterned photoresist layer serving as a mask; and removing the patterned photoresist layer.

Optionally, etching away 25% to 50% of a thickness of the interlayer dielectric layer.

Optionally, the formation of the sidewall spacer may comprise:

forming a sidewall spacer material layer over inner walls of the opening and over the top metal layer; and etching away portions of the sidewall spacer material layer over the bottom of the opening and over the top metal layer, with a remaining portion of the sidewall spacer material layer forming the sidewall spacer.

Optionally, the sidewall spacer material layer may be thicker than the interlayer dielectric layer.

The present invention provides an MIM capacitor structure and a method for fabricating the structure. The capacitor structure includes a bottom metal layer, an interlayer dielectric layer and a top metal layer that are sequentially stacked over a substrate. A number of openings extend downward through the top metal layer into the interlayer dielectric layer. Recesses are formed at side walls of the openings and extend downward from bottoms of the openings into the interlayer dielectric layer. These recesses are formed as a result of greater amounts of material being removed due to concentration of plasma there during an etching process performed on the top metal layer. Due to the presence of the recesses, the interlayer dielectric layer between the top metal layer and the bottom metal layer is thinner around edges of the top metal layer. Since the thickness of the interlayer dielectric layer between the top metal layer and the bottom metal layer around the edges of the top metal layer also affects, and is proportional to, the breakdown voltage of the MIM capacitor structure, it can reduce the breakdown voltage of the resulting MIM capacitor structure. Sidewall spacers are located in the openings and extend over side walls of the top metal layer and downward into the recesses so as to fill them up. Filling the recesses with the sidewall spacers ensures that the interlayer dielectric layer between the top metal layer and the bottom metal layer has a sufficient thickness to impart an increased breakdown voltage to the MIM capacitor structure.

BRIEF DESCRIPTION OF THE DRAWINGS

FIGS. 4A to 4E are schematic cross-sectional views of structures formed as a result of steps in a method for fabricating an MIM capacitor structure according to an embodiment of the present invention, in which FIG. 4E is a schematic cross-sectional view of an MIM capacitor structure according to an embodiment of the present invention.

Figure 1:
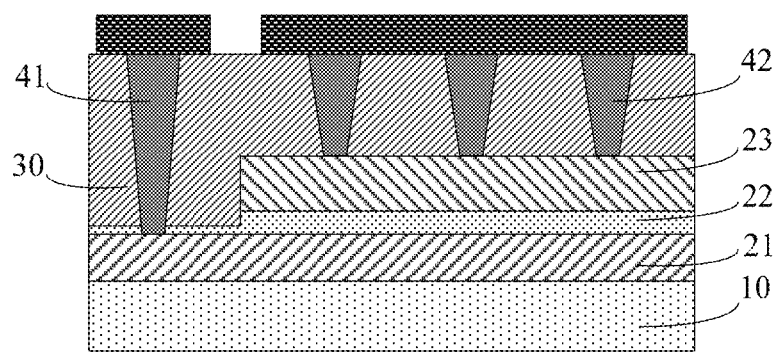
FIG. 1 is a schematic cross-sectional view of an MIM capacitor structure.

reference numerals in figures:

10, 10', 100—Substrate; 21, 21', 201—Bottom Metal Layer; 22, 22', 202—Interlayer Dielectric Layer; 23, 23', 203—Top Metal Layer; 30, 600—Passivation Layer; 41, 710—First Electrical Connection Element; 42, 720—Second Electrical Connection Element; 300—Patterned Photoresist Layer; 400—Opening; 500—Sidewall Spacer Material Layer; 510—Sidewall Spacer.

DETAILED DESCRIPTION

Figure 2:
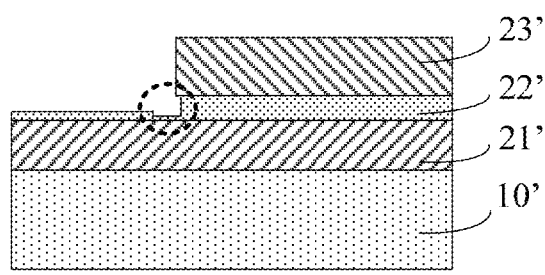
FIG. 2 is a schematic cross-sectional view of a recess formed as a result of a step in a method for fabricating an MIM capacitor structure.

FIG. 2 is a schematic cross-sectional view of a recess formed as a result of a step in a method for fabricating a metal-insulator-metal (MIM) capacitor structure. Referring to FIG. 2, a bottom metal layer 21', an interlayer dielectric layer 22' and a top metal layer 23' are formed over a substrate 10'. Since the interlayer dielectric layer 22' determines capacitance of the MIM capacitor structure, if the interlayer dielectric layer 22' has few defects, then a breakdown voltage of the MIM capacitor structure will be primarily determined by etching of the top metal layer 23'. The fabrication of the MIM capacitor structure may involve patterning a photoresist layer (not shown) on the top metal layer 23' and, with the patterned photoresist layer serving as a mask, etching the top metal layer 23' to form an opening extending through the top metal layer 23' and a surface of the interlayer dielectric layer 22' is exposed in the opening. However, in order to completely remove the top metal layer 23' in the opening, an over-etch process is generally utilized, which stops within the interlayer dielectric layer 22'. Therefore, this over-etch process will lead to a thickness loss of the interlayer dielectric layer 22', especially at a location indicated by the dotted circle in FIG. 2, the over-etch process may form a recess. This is because plasma used in the etching process tends to concentrate at the location indicated by the dotted circle, leading to a greater amount of material being etching away there, and a recess is formed. Consequently, the recess causes that a portion of the interlayer dielectric layer 22' between the top metal layer 23' and the bottom metal layer 21' is thinner around an edge of the top metal layer 23'. Since the thickness of the interlayer dielectric layer 22' between the top metal layer 23' and the bottom metal layer 21' around that edge of the top metal layer 23' also affects, and is proportional to, the breakdown voltage of the MIM capacitor structure, it will reduce the breakdown voltage of the resulting MIM capacitor structure and degrade its time-dependent dielectric breakdown (TDDB) performance.

In view of this, the present invention provides an MIM capacitor structure and a method for fabricating the structure. The capacitor structure includes: a bottom metal layer, an interlayer dielectric layer and a top metal layer, which are sequentially stacked over a substrate; a number of openings extend downward through the top metal layer into the interlayer dielectric layer; and recesses located at side walls of the openings and extending downward from their bottoms into the interlayer dielectric layer. These recesses form as a result of greater amounts of material being removed due to concentration of plasma there during an etching process performed on the top metal layer. Thus, the interlayer dielectric layer between the top metal layer and the bottom metal layer is thinner around edges of the top metal layer. Since the thickness of the interlayer dielectric layer between the top metal layer and the bottom metal layer around the edges of the top metal layer also affects, and is proportional to, the breakdown voltage of the MIM capacitor structure, it can reduce the breakdown voltage of the resulting MIM capacitor structure. The capacitor structure further includes sidewall spacers located in the openings, which extend over side walls of the top metal layer and downward into the recesses so as to fill them up. Filling the recesses with the sidewall spacers ensures that the interlayer dielectric layer between the top metal layer and the bottom metal layer has a sufficient thickness to impart an increased breakdown voltage to the MIM capacitor structure.

Specific embodiments of the present invention will be described in greater detail below with reference to the accompanying drawings. Advantages and features of the invention will become more apparent from the following description. Note that the figures are provided in a very simplified form not necessarily drawn to exact scale and for the only purpose of facilitating easy and clear description of the embodiments.

Figure 4A:
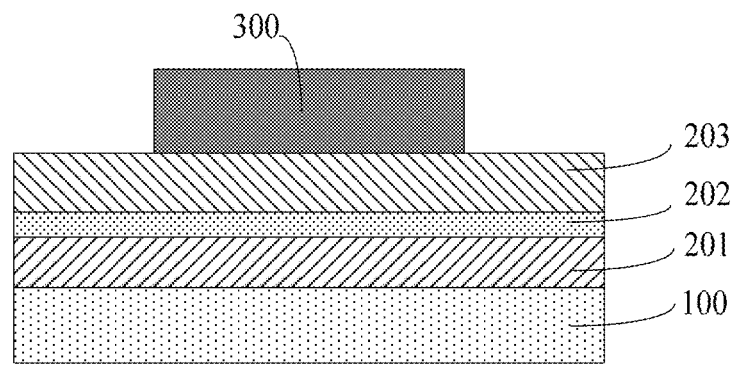
Figure 4B:
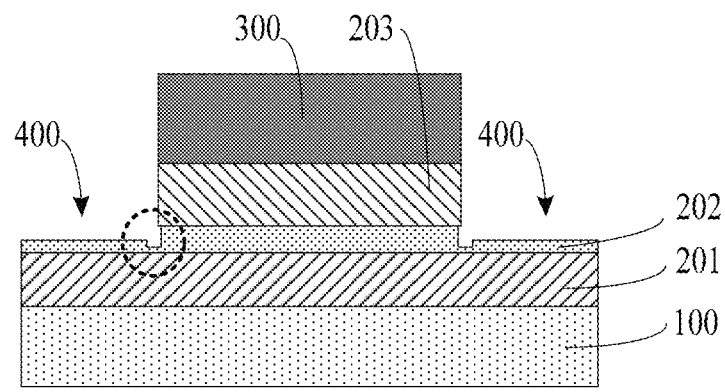
Figure 4C:
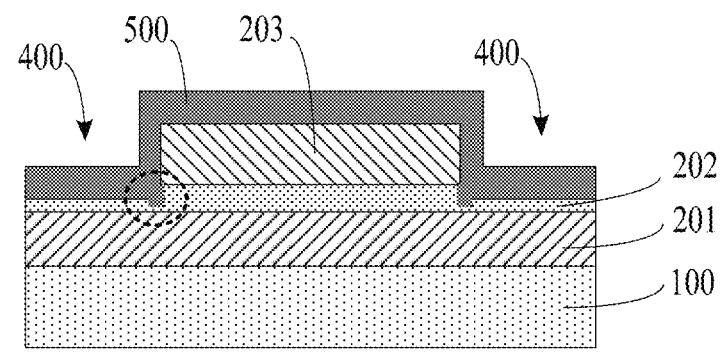
Figure 4D:
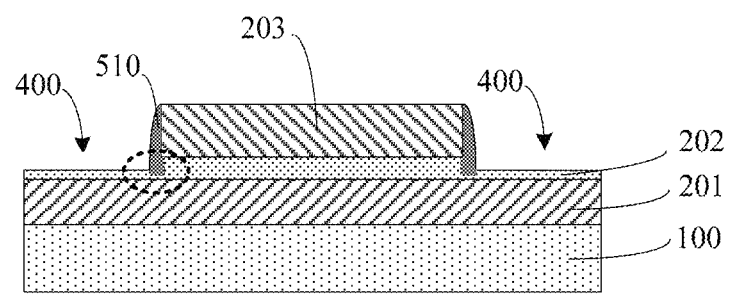
Figure 4E:
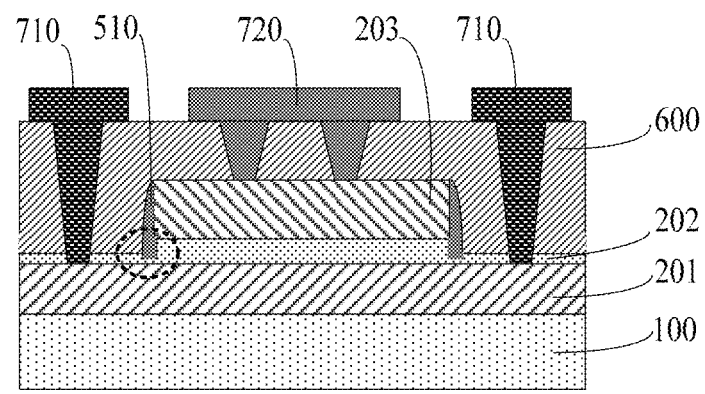

FIG. 4E is a schematic cross-sectional view of an MIM capacitor structure according to an embodiment of the present invention. Referring to FIG. 4E, the MIM capacitor structure includes a substrate 100, a capacitor structure, a number of openings, recesses, sidewall spacers 510, a passivation layer 600 and at least two electrical connection elements. The capacitor structure is formed on the substrate 100, and device structures, metal interconnect structures and a metal interconnect layer (not shown) may be formed in the substrate 100. The capacitor structure is formed on the metal interconnect layer and thereby connected to the metal interconnect structures.

The capacitor structure includes a bottom metal layer 201, an interlayer dielectric layer 202 and a top metal layer 203, which are sequentially stacked over the substrate 100. In this embodiment, each of the bottom metal layer 201 and the top metal layer 203 is made of a material including one or more of titanium, copper or aluminum. It may also include nitrogen. For example, the bottom metal layer 201 may be a copper-aluminum alloy, and the top metal layer 203 may be titanium nitride. The interlayer dielectric layer 202 is made of a material including any of silicon nitride, silicon oxide or silicon oxynitride, with silicon nitride being preferred because of its high dielectric constant.

The openings (not labeled) extend downward through the top metal layer 203 into the interlayer dielectric layer 202. The recesses (not labeled) are located at side walls of the openings and extend downward from the bottoms of openings into the interlayer dielectric layer. These recesses form as a result of greater amounts of material being removed due to concentration of plasma there during an etching process performed on the top metal layer 203. Due to the presence of the recesses, the interlayer dielectric layer 202 between the top metal layer 203 and the bottom metal layer 201 is thinner around edges of the top metal layer 203. Since the thickness of the interlayer dielectric layer 202 between the top metal layer 203 and the bottom metal layer 201 around the edges of the top metal layer 203 also affects, and is proportional to, the breakdown voltage of the MIM capacitor structure, it can reduce the breakdown voltage of the resulting MIM capacitor structure.

The sidewall spacers 510 are located in the openings. They extend over side walls of the top metal layer 203 and downward into the recesses so as to fill them up (as indicated by the dotted circles in the figures). In this embodiment, the sidewall spacers 510 are made of the same material as the interlayer dielectric layer 202. That is, material of the sidewall includes any of silicon nitride, silicon oxide or silicon oxynitride. Filling the recesses with the sidewall spacers 510 can avoid the interlayer dielectric layer 202 between the bottom metal layer 201 and the top metal layer 203 from having a reduced thickness around the edges of the top metal layer 203 due to the presence of the recesses, thereby ensuring that the interlayer dielectric layer 202 between the top metal layer 203 and the bottom metal layer 201 has a sufficient thickness to impart an increased breakdown voltage to the MIM capacitor structure.

The passivation layer 600 covers the top metal layer 203 and fills up the openings (which are not labeled because of being filled with the passivation layer 600). The passivation layer 600 covering the top metal layer 203 and filling up the openings has a flat surface. The at least two electrical connection elements extend through the passivation layer 600 and are respectively electrically connected to the bottom metal layer 201 and the top metal layer 203. The at least two electrical connection elements include at least one first electrical connection element 710 (two first electrical connection elements 710 are shown in the figures) and at least one second electrical connection element 720 (one second electrical connection element 720 is shown in the figures). The first electrical connection element 710 extends through the passivation layer 600 in one opening and the interlayer dielectric layer 202, and is electrically connected to the bottom metal layer 201. The second electrical connection element 720 extends through the passivation layer 600 and is electrically connected to the top metal layer 203.

Figure 3:
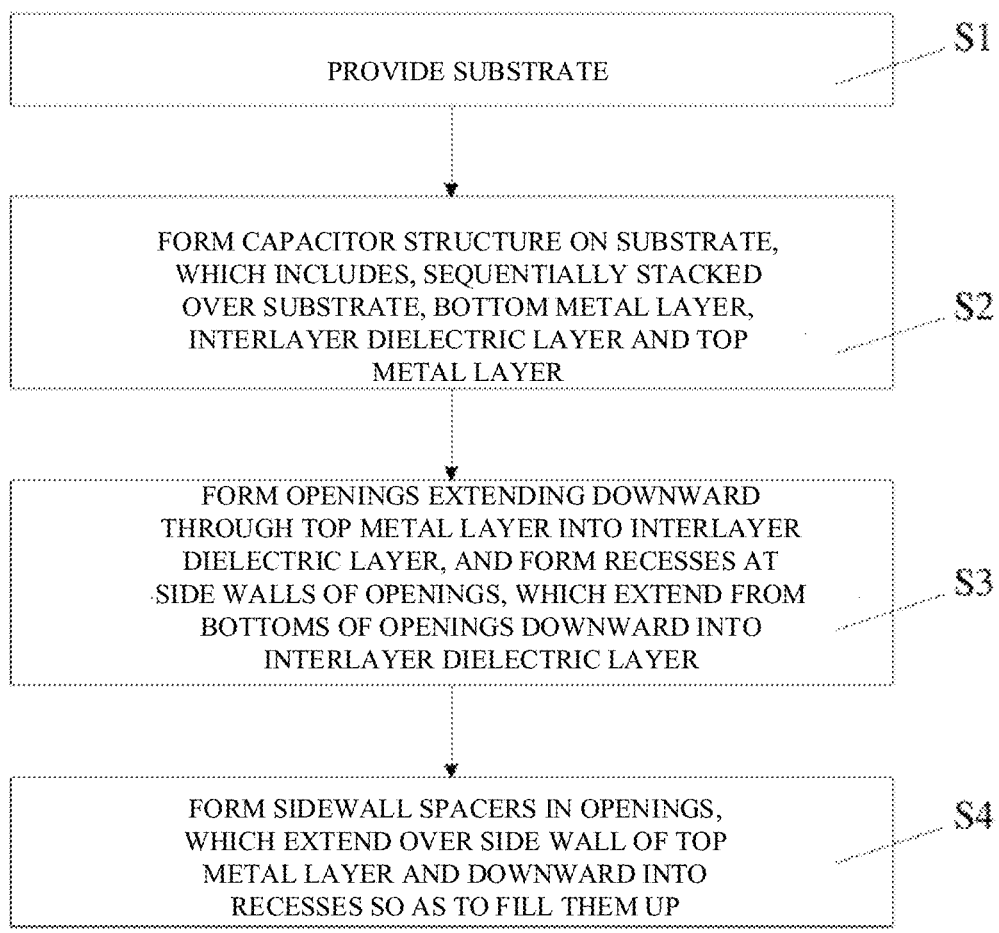
FIG. 3 is a flowchart of a method for fabricating an MIM capacitor structure according to an embodiment of the present invention.

FIG. 3 is a flowchart of a method for fabricating an MIM capacitor structure according to an embodiment of the present invention. Referring to FIG. 3, the method includes the steps as follows:

step S1: providing a substrate.

step S2: forming a capacitor structure on the substrate. The capacitor structure includes a bottom metal layer, an interlayer dielectric layer and a top metal layer that are sequentially stacked over the substrate.

step S3: forming a number of openings extending downward through the top metal layer into the interlayer dielectric layer. As a result of the formation of the openings, recesses are formed at side walls of the openings, which extend from bottoms of the openings downward into the interlayer dielectric layer.

step S4: forming sidewall spacers in the openings, which extend over side walls of the top metal layer and downward into the recesses so as to fill them up.

FIGS. 4A to 4E are schematic cross-sectional views of structures formed as a result of steps in a method for fabricating an MIM capacitor structure according to an embodiment of the present invention. The method will be described in detail below with reference to FIGS. 4A to 4E.

Referring to FIG. 4A, in step S1, a substrate 100 is provided, in which device structures, metal interconnect structures and a metal interconnect layer (not shown) are formed. Subsequently, a capacitor structure is formed on the metal interconnect layer and thereby connected to the metal interconnect structures.

With continued reference to FIG. 4A, in step S2, a bottom metal layer 201, an interlayer dielectric layer 202, a top metal layer 203 and a patterned photoresist layer 300 are sequentially formed over the substrate 100. In this embodiment, the bottom metal layer 201 and the top metal layer 203 are each made of a material including one or more of titanium, copper or aluminum. It may also include nitrogen. For example, the bottom metal layer 201 may be a copper-aluminum alloy, and the top metal layer 203 may be titanium nitride. The interlayer dielectric layer 202 is made of a material including any of silicon nitride, silicon oxide or silicon oxynitride, with silicon nitride being preferred because of its high dielectric constant.

Referring to FIG. 4B, in step S3, with the patterned photoresist layer 300 serving as a mask, a dry etching process is performed to etch the top metal layer 203 and a partial thickness of the interlayer dielectric layer 202, thereby forming openings 400 extending downward through the top metal layer 203 into the interlayer dielectric layer 202. During the formation of the openings 400, recesses are also formed around side walls of the openings 400 (as indicated by the dotted circles in the figures). The recesses extend downward from bottoms of the openings 400 into the interlayer dielectric layer 202. These recesses are formed as a result of greater amounts of material being removed due to concentration of plasma there during the etching process on the top metal layer 203. Due to the presence of the recesses, the interlayer dielectric layer 202 between the top metal layer 203 and the bottom metal layer 201 is thinner around edges of the top metal layer 203. Since the thickness of the interlayer dielectric layer 202 between the top metal layer 203 and the bottom metal layer 201 around the edges of the top metal layer 203 also affects, and is proportional to, the breakdown voltage of the MIM capacitor structure being fabricated, it can reduce the breakdown voltage of the resulting MIM capacitor structure. In this embodiment, the etching process using the patterned photoresist layer 300 as a mask is an over-etch process which ensures complete removal of the top metal layer 203 in the openings. To this end, a partial thickness, in particular 25%-50% of the thickness, of the interlayer dielectric layer 202 has to be also removed. After that, the patterned photoresist layer 300 is stripped away.

Referring to FIGS. 4C and 4D, in step S4, a sidewall spacer material layer 500 is formed, which covers inner walls of the openings 400 and the top metal layer 203. Subsequently, portions of the sidewall spacer material layer 500 above the bottoms of the openings 400 and above the top metal layer 203 are etched away, and the remaining portions thereof form sidewall spacers 510, which are located in the openings 400 and extend over side walls of the top metal layer 203 and downward into the recesses so as to fill them up (as indicated by the dotted circles in the figures). In this embodiment, the sidewall spacer material layer 500 is thicker than the interlayer dielectric layer 202 and is formed on the inner walls of the openings 400 and the top metal layer 203 using a chemical vapor deposition (CVD) process.

Referring to FIG. 4E, subsequent to the formation of the sidewall spacers 510, a passivation layer 600 is formed on the top metal layer 203, which fills the openings and has a flat surface.

With continued reference to FIG. 4E, after the passivation layer 600 is formed on the top metal layer 203, at least two electrical connection elements are formed in the passivation layer 600. The at least two electrical connection elements include at least one first electrical connection element 710 (two first electrical connection elements 710 are shown in the figures) and at least one second electrical connection element 720 (one second electrical connection element 720 is shown in the figures). The first electrical connection element 710 extends through the passivation layer 600 in one opening and the interlayer dielectric layer 202, and is electrically connected to the bottom metal layer 201. The second electrical connection element 720 extends through the passivation layer 600 and is electrically connected to the top metal layer 203. Specifically, etching the passivation layer 600 in the opening and the interlayer dielectric layer 202 to form a number of first through-holes therein. The first through-hole exposes surface of the bottom metal layer 201 and is filled therein with metal to form a first plug. The first electrical connection element 710 may be then formed by forming a first pad on the first plug. In addition, etching the passivation layer 600 to form a number of second though-holes in the passivation layer 600. The second through-hole exposes a surface of the top metal layer 203 and is filled therein with metal to form a second plug. The second electrical connection element 720 may be then formed by forming a second pad on the second plug. In this embodiment, the metals filled in the first and second through-holes may include one of tungsten, aluminum or copper, but the present invention is not so limited.

In summary, the present invention provides an MIM capacitor structure and a method for fabricating the structure. The capacitor structure includes a bottom metal layer, an interlayer dielectric layer and a top metal layer that are sequentially stacked over a substrate. A number of openings extend downward through the top metal layer into the interlayer dielectric layer. There are recesses at side walls of the openings, which extend downward from bottoms of the openings into the interlayer dielectric layer. These recesses are formed as a result of greater amounts of material being removed due to concentration of plasma there during an etching process performed on the top metal layer. Due to the presence of the recesses, the interlayer dielectric layer between the top metal layer and the bottom metal layer is thinner around edges of the top metal layer. Since the thickness of the interlayer dielectric layer between the top metal layer and the bottom metal layer around the edges of the top metal layer also affects, and is proportional to, the breakdown voltage of the MIM capacitor structure, it can reduce the breakdown voltage of the resulting MIM capacitor structure. The capacitor structure further includes sidewall spacers located in the openings, which extend over side walls of the top metal layer and downward into the recesses so as to fill them up. Filling the recesses with the sidewall spacers ensures that the interlayer dielectric layer between the top metal layer and the bottom metal layer has a sufficient thickness to impart an increased breakdown voltage to the MIM capacitor structure.

Presented above are merely some preferred embodiments of the present invention, which do not limit the invention in any way. Changes in any forms made to the principles and teachings disclosed herein, including equivalents and modifications, by any person of ordinary skill in the art without departing from the scope of the invention are intended to fall within the scope of the invention.

What is claimed is:

1. A metal-insulator-metal (MIM) capacitor structure, comprising:
   a substrate;
   a capacitor structure, comprising a bottom metal layer, an interlayer dielectric layer and a top metal layer that are sequentially stacked over the substrate;
   an opening extending downward through the top metal layer into the interlayer dielectric layer;
   a recess, formed at a side wall of the opening and extending from a bottom of the opening downward into the interlayer dielectric layer; and
   a sidewall spacer located in the opening, wherein the sidewall spacer extends over a side wall of the top metal layer and downward into the recess so as to fill up the recess,
   wherein the interlayer dielectric layer is made of a same material as the sidewall spacer.

2. The MIM capacitor structure of claim 1, wherein each of the bottom metal layer and the top metal layer is made of a material comprising one or more of titanium, copper or aluminum.

3. The MIM capacitor structure of claim 1, wherein the recess comprises a first section and a second section that are joined, wherein the first section is located at the side wall of the opening and extends downward from an upper surface of the interlayer dielectric layer that is at the side wall of the opening into the interlayer dielectric layer, wherein the second section extends downward from the bottom of the opening into the interlayer dielectric layer.

4. The MIM capacitor structure of claim 1, wherein each of the interlayer dielectric layer and the sidewall spacer is made of a material comprising any one of silicon nitride, silicon oxide or silicon oxynitride.

5. The MIM capacitor structure of claim 1, further comprising:
 a passivation layer covering the top metal layer and filling the opening;
 a first electrical connection element located in the opening, wherein the first electrical connection element extends through the passivation layer and is electrically connected to the bottom metal layer;
 a second electrical connection element located above the top metal layer, wherein the second electrical connection element extends through the passivation layer and is electrically connected to the top metal layer.

6. A method for fabricating a metal-insulator-metal (MIM) capacitor structure, comprising:
 providing a substrate;
 forming a capacitor structure on the substrate, wherein the capacitor structure comprises a bottom metal layer, an interlayer dielectric layer and a top metal layer that are sequentially stacked over the substrate;
 forming an opening extending downward through the top metal layer into the interlayer dielectric layer, wherein as a result of the formation of the opening, a recess is formed at a side wall of the opening, and wherein the recess extends from a bottom of the opening further downward into the interlayer dielectric layer; and
 forming a sidewall spacer in the opening, wherein the sidewall spacer extends over a side wall of the top metal layer and downward into the recess so as to fill up the recess,
 wherein the interlayer dielectric layer is made of a same material as the sidewall spacer.

7. The method of claim 6, wherein the formation of the capacitor structure and the opening comprises:
 sequentially forming the bottom metal layer, the interlayer dielectric layer, the top metal layer and a patterned photoresist layer that are stacked one above another over the substrate;
 forming the opening and the recess by etching away a portion of the top metal layer and a partial thickness of the interlayer dielectric layer, with the patterned photoresist layer serving as a mask; and
 removing the patterned photoresist layer.

8. The method of claim 7, wherein etching away 25% to 50% of a thickness of the interlayer dielectric layer.

9. The method of claim 7, wherein the recess comprises a first section and a second section that are joined, wherein the first section is located at the side wall of the opening and extending downward from an upper surface of the interlayer dielectric layer that is at the side wall of the opening into the interlayer dielectric layer, wherein the second section extends downward from the bottom of the opening into the interlayer dielectric layer.

10. The method of claim 6, wherein the formation of the sidewall spacer comprises:
 forming a sidewall spacer material layer over inner walls of the opening and over the top metal layer; and
 etching away portions of the sidewall spacer material layer over the bottom of the opening and over the top metal layer, with a remaining portion of the sidewall spacer material layer forming the sidewall spacer.

11. The method of claim 10, wherein the sidewall spacer material layer is thicker than the interlayer dielectric layer.

* * * * *